US012770830B2

(12) United States Patent
Takamatsu

(10) Patent No.: US 12,770,830 B2
(45) Date of Patent: Oct. 20, 2026

(54) HIGH FREQUENCY REACTION PROCESSING APPARATUS AND HIGH FREQUENCY REACTION PROCESSING SYSTEM

(71) Applicant: SST INC., Chiba (JP)

(72) Inventor: Toshiyuki Takamatsu, Chiba (JP)

(73) Assignee: SST INC., Chiba (JP)

( * ) Notice: Subject to any disclaimer, the term of this patent is extended or adjusted under 35 U.S.C. 154(b) by 578 days.

(21) Appl. No.: 17/913,774

(22) PCT Filed: Feb. 26, 2021

(86) PCT No.: PCT/JP2021/007258
§ 371 (c)(1),
(2) Date: Sep. 22, 2022

(87) PCT Pub. No.: WO2021/192810
PCT Pub. Date: Sep. 30, 2021

(65) Prior Publication Data
US 2024/0212986 A1 Jun. 27, 2024

(30) Foreign Application Priority Data
Mar. 23, 2020 (JP) ................................ 2020-051160

(51) Int. Cl.
*H01J 37/32* (2006.01)
*H05H 1/46* (2006.01)

(52) U.S. Cl.
CPC .. *H01J 37/32229* (2013.01); *H01J 37/32192* (2013.01); *H01J 37/32467* (2013.01);
(Continued)

(58) Field of Classification Search
CPC .......... H01J 37/32009; H01J 37/32229; H01J 37/32247; H01J 37/32036;
(Continued)

(56) References Cited

U.S. PATENT DOCUMENTS 5,961,851 A * 10/1999 Kamarehi ......... H01J 37/32192 204/298.38
9,095,039 B2 * 7/2015 Hirayama ......... H01J 37/32082
(Continued)

FOREIGN PATENT DOCUMENTS

JP 06-291087 A 10/1994
JP 3637397 B2 4/2005
(Continued)

OTHER PUBLICATIONS

International Search Report for PCT/JP2021/007258 mailed on Apr. 27, 2021.

*Primary Examiner* — Aiden Lee
(74) *Attorney, Agent, or Firm* — ASLAN LAW, P.C.

(57) ABSTRACT

A high frequency reaction processing apparatus and a high frequency reaction processing system capable of reducing a loss of energy of an electromagnetic wave continuously returning to and passing through a propagation line in a loop are provided. A dielectric outer container 40, a covering conductor 43 made of a conductive material and kept at the same potential as ground potential of a high frequency waveguide to form a spatial region with an outer surface of the dielectric outer container 43, at least one high frequency wave coupling portion 42, and at least one dielectric inner container 41 are comprised.

10 Claims, 5 Drawing Sheets

(52) U.S. Cl.
CPC .......... *H01J 2237/327* (2013.01); *H05H 1/46* (2013.01); *H05H 1/4622* (2021.05)

(58) Field of Classification Search
CPC ........... H01J 37/32091; H01J 37/32211; H01J 37/32293; H01J 37/32467; H01J 37/32513; H01J 37/3244; H01J 37/32715; H01J 37/32733; H01J 37/32834; H01J 37/3222; H01J 2237/327; H01J 37/32082; H01J 37/32192–32311; H05H 1/46–4637
See application file for complete search history.

(56) References Cited

U.S. PATENT DOCUMENTS

| | | | | |
|---|---|---|---|---|
| 10,121,638 | B1 * | 11/2018 | Wu | H01J 37/32009 |
| 2002/0043341 | A1 * | 4/2002 | Kanetsuki | C23C 16/511<br>118/723 MW |
| 2004/0027302 | A1 * | 2/2004 | Ishii | H01J 37/32192<br>343/770 |
| 2004/0149224 | A1 * | 8/2004 | Wang | H01J 37/32192<br>118/723 ME |
| 2005/0212626 | A1 * | 9/2005 | Takamatsu | H05B 6/70<br>219/756 |
| 2005/0250338 | A1 * | 11/2005 | Ohmi | H01J 37/32238<br>257/E21.279 |
| 2017/0032933 | A1 * | 2/2017 | Harada | H01J 37/3222 |
| 2018/0226230 | A1 * | 8/2018 | Kobayashi | H01J 37/32311 |

FOREIGN PATENT DOCUMENTS

| | | | | | |
|---|---|---|---|---|---|
| JP | 2005-259633 | A | | 9/2005 | |
| JP | 2017-033749 | A | | 2/2017 | |
| KR | 2010123765 | A | * | 11/2010 | H01J 37/32192 |
| KR | 2013117270 | A | * | 10/2013 | |
| WO | 2003/096769 | A1 | | 11/2003 | |
| WO | WO-2013051248 | A1 | * | 4/2013 | C23C 16/45563 |
| WO | WO-2013132911 | A1 | * | 9/2013 | H01J 37/3222 |

* cited by examiner

HIGH FREQUENCY REACTION PROCESSING APPARATUS AND HIGH FREQUENCY REACTION PROCESSING SYSTEM

CROSS-REFERENCE TO RELATED APPLICATIONS

This is a 35 U.S.C. 371 National Stage Patent Application of International Application No. PCT/JP2021/007258, filed Feb. 26, 2021, which claims priority to Japanese application 2020-051160, filed Mar. 23, 2020, each of which is hereby incorporated by reference in its entirety.

TECHNICAL FIELD

The present invention relates to a high frequency reaction processing apparatus and a high frequency reaction processing system for processing a target material with an electromagnetic wave by high frequency excitation.

BACKGROUND ART

Patent Document 1 discloses a high frequency reaction processing apparatus in which a propagation line of high frequency waves is formed so as to return in a loop by a cylindrical or spherical dielectric container. The high frequency reaction processing apparatus comprises an outer container formed of a dielectric and an inner container formed of a dielectric disposed inside the outer container, and the high frequency wave coupling portions are provided on outer surface of the outer container, and a covering portion of the conductor which is kept at a ground potential is provided on the other outer surface portion.

The high frequency reaction processing apparatus disclosed in Patent Document 1 can have a large number of strong electric field points due to evanescent surface waves in the reaction processing region inside the inner container. Further, it is possible to propagate the electromagnetic wave from the high frequency waveguide line to the direction of the infinitely long dielectric propagation line, it can configure a large infinitely long dielectric transmission line with a large area.

PRIOR ART LITERATURE

Patent Literature

[Patent Document 1] Japanese Patent No. 3637397

DISCLOSURE OF THE INVENTION

Problem to be Solved by the Invention

In the high frequency reaction processing apparatus described above, an infinitely long dielectric propagation line is configured. The infinitely long dielectric propagation line refers to a high frequency wave propagation line that returns in a loop by a cylindrical or spherical dielectric container. Then, by propagating the electromagnetic wave from the high frequency waveguide line to the direction of the infinitely long dielectric propagation line, evanescent waves are generated and propagated continuously inside the inner container, the supplied energy of the high frequency wave is absorbed by the load inside the inner container.

However, when a load inside the inner container to be subjected to the reaction has poor absorption efficiency, energy of the high frequency is not efficiently absorbed by the internal load. Then, a part of the energy of the electromagnetic wave that continuously returns and passes through the infinitely long dielectric propagation line by the outer container in a loop is absorbed by the dielectric loss of the dielectric material, and a part of the loss is consumed as heat loss.

The present invention has been made in view of the above circumstances, and an object thereof is to provide a high frequency reaction processing apparatus and a high frequency reaction processing system capable of reducing a loss of energy of an electromagnetic wave continuously returning to and passing through a propagation line in a loop.

Means for Solving the Problem (1) In order to achieve the above objectives, the high frequency wave response processing apparatus of the present invention comprises an outer container made of a dielectric material and having an inner cavity capable of being closed by two end faces, a covering portion made of a conductive material and kept at the same potential as ground potential of a high frequency waveguide to form a spatial region with an outer surface of the outer container, at least one high frequency wave coupling portion provided at any position of an outer surface of the covering portion, and at least one inner container made of a dielectric material, provided at a position for receiving a high frequency wave travelling through the high frequency wave coupling portion without touching an inner side face of the outer container and having an inner cavity capable of being closed by two end faces, wherein reaction process is performed by electromagnetic waves guided from the high frequency wave coupling portion in the inner cavity of the inner container.

Thus, by providing a space between the covering portion and the outer container for the evanescent wave generated by the outer container of dielectric, absorption of the electromagnetic wave by the outer container can be suppressed and the processing efficiency can be improved.

(2) Further, the high frequency reaction processing apparatus of the present invention further comprises a lid portion made of conductor kept at the same potential as ground potential of the high frequency waveguide, the lid portion closing the inner cavity of the inner container at an end face of the inner container, wherein the lid portion has a fitting groove for fitting an end part of the inner container, and the fitting groove has a depth with a length of ⅛ wavelength or more and ½ wavelength or less of the guided high frequency wave and accommodates an end part of the inner container without contacting a side surface of the inner container. Thus, since the electromagnetic wave is choked without entering the fitting groove, it is possible to keep a low temperature of the end portion of the inner container.

(3) Further, the high frequency reaction processing system of the present invention comprises a plurality of the high frequency reaction processing apparatuses according to any one of the above and a single processing chamber connected to the inner cavity of the inner container via an end face on one side of the inner container of each of the plurality of high frequency reaction processing apparatuses. Thus, a processing reaction with a large output can be expanded to a large area.

Advantageous Effect of the Invention

According to the present invention, it is possible to reduce a loss of energy of an electromagnetic wave continuously returning to and passing through a propagation line in a loop.

BEST MODES FOR CARRYING OUT THE INVENTION

First Embodiment

Figure 1A:
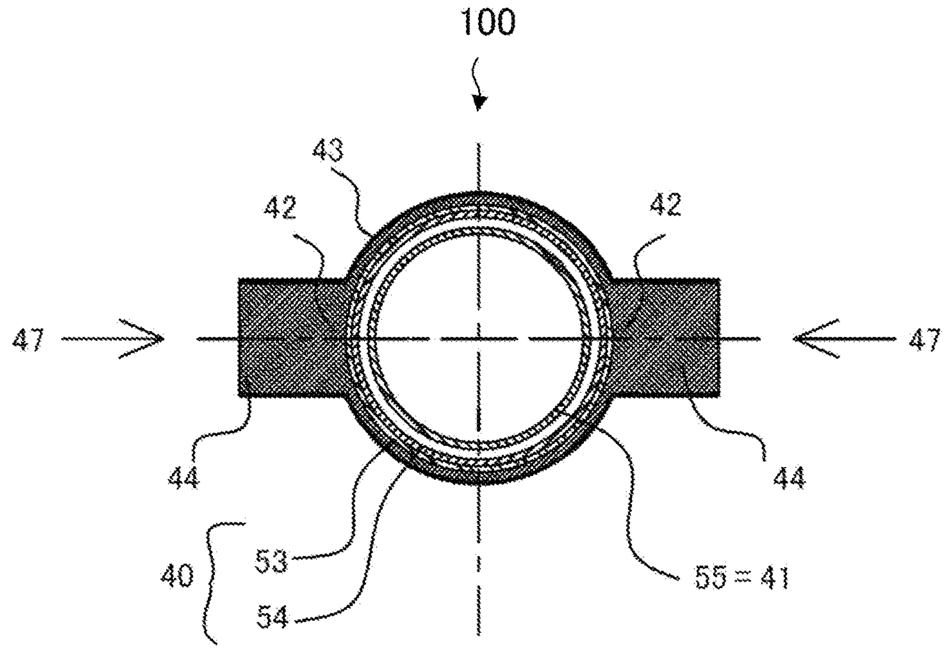
FIGS. 1A and 1B are respectively a cross-sectional plan view and a cross-sectional front view on y1-y2 of the high frequency reaction processing apparatus according to the first embodiment.
Figure 1B:
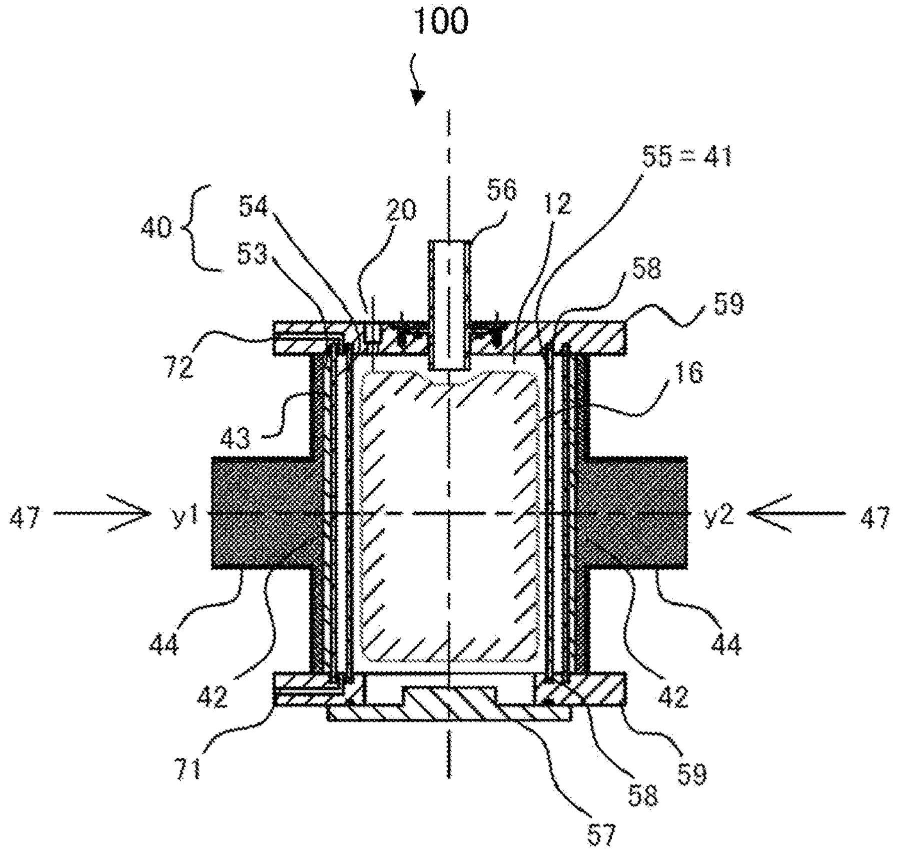

FIGS. 1A and 1B are respectively a plan cross-sectional view and a front cross-sectional view on y1-y2 of the high frequency reaction processing apparatus 100 according to the first embodiment. The high frequency reaction processing apparatus 100 comprises a dielectric outer container 40 (outer container), a covering conductor 43 (covering portion), high frequency wave coupling portions 42, a dielectric inner container 41 (inner container) and vacuum container walls 59 (lid portions). The dielectric outer container 40 is configured of a fluororesin film layer 53 and a quartz tube 54. The dielectric inner container 41 is configured of a quartz tube 55. The high frequency wave coupling portion 42 is provided at any position of the outer surface of the covering conductor 43. A plurality of high frequency wave coupling portions 42 may be provided for one covering conductor 43.

The dielectric inner container 41 is made of a dielectric material and is provided at a position for receiving a high frequency wave traveling through the high frequency wave coupling portion 42 without contacting the inner side face of the dielectric outer container 40. The dielectric inner container 41 has an inner cavity (inner space) closed by two end faces formed by vacuum container walls 59. A plurality of dielectric inner containers 41 may be provided for one outer container. The high frequency reaction processing apparatus 100 performs reaction processing by electromagnetic waves guided from the high frequency wave coupling portions 42 in the inner cavity of the dielectric inner container 41.

Figure 2:
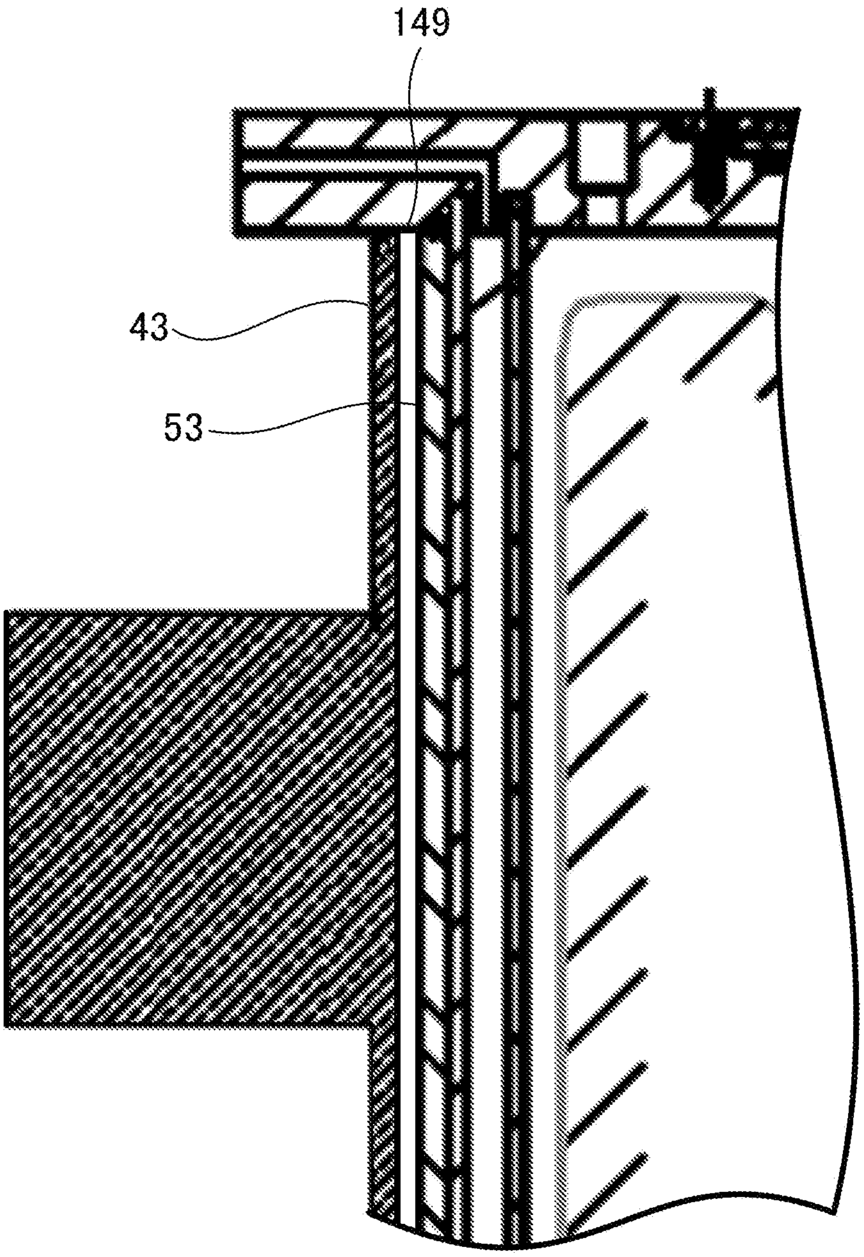
FIG. 2 is an enlarged cross-sectional front view of the high frequency reaction processing apparatus according to the first embodiment.

As shown in FIGS. 1A and 1B, the high frequency reaction processing apparatus 100 can configure a discharge portion of a high frequency plasma apparatus. y1-y2 represents a center line parallel to high frequency waveguides (hereinafter, the same). FIG. 2 is an enlarged front cross-sectional view of the high frequency reaction processing apparatus 100 according to the first embodiment.

The dielectric outer container 40 is made of a dielectric material, and its inner cavity (inner space) is closed by two end faces configured of vacuum container walls 59 (lid portions). The covering conductor 43 is made of a conductive material to form a spatial region 149 with the outer surface of the dielectric outer container 40 and is kept at the same potential as the ground potential of the high frequency waveguide. Thus, although evanescent wave is generated by the dielectric outer container 40 on the inside of the covering conductor 43 serving as a waveguide, the absorption of electromagnetic waves by the dielectric outer container 40 is suppressed by providing the spatial region 149 between the covering conductor 43 and the dielectric outer container 40 to improve the processing efficiency.

The spatial region 149 is preferably formed by separating 1/60 wavelength or more 1/4 wavelength or less of the traveling high frequency wave between the inner surface of the covering conductor 43 and the outer surface of the dielectric outer container 40. Thus, it is possible to provide the dielectric inner container 41 at a position of 1/4 wavelength from the inner side face of the covering conductor 43, which is corresponding to the peak of the evanescent wave, and to improve the processing efficiency.

The vacuum container walls 59 are formed on the respective end faces of the dielectric inner container 41, the dielectric outer container 40 and the covering conductor 43. The vacuum container walls 59 are configured of conductors kept at the same potential as the ground potential of the high frequency waveguide, to close the inner cavity of the dielectric inner container 41 and the dielectric outer container 40 at the end faces of the dielectric outer container 40 and the dielectric inner container 41. The vacuum container wall 59 has a locking portion 235 for holding the dielectric outer container 40 apart from the covering conductor 43. Thus, a constant distance can be arranged between the inner surface of the covering conductor 43 and the outer surface of the dielectric outer container 40. The locking portion 235 can be formed, for example, as a groove into which the covering conductor 43 is fitted.

As shown in FIGS. 1A and 1B, in the high frequency reaction processing apparatus 100, high frequency waves 47 are emitted from two microwave oscillating portions and are guided into a vacuum container 12 through the high frequency waveguides 44. The vacuum container 12 functions as a central part of the discharge portion. The high frequency waveguide 44 refers to a propagation line of high frequency wave formed by a waveguide or waveguide and spatial region.

The vacuum container 12 is configured of a cylindrical quartz tube 55 as the dielectric container 41 and the upper and lower aluminum vacuum container walls 59 and an aluminum door sample stage 57 and sealed for vacuum by O-rings 58. In the vacuum container wall 59, a decompression exhaust port 56 is provided for exhausting gas and reducing pressure. A gas for generating plasma is introduced from a process gas inlet 20 while the flow rate is controlled.

The process up to the plasma generation using the high frequency reaction processing apparatus 100 configured as described above is outlined as blow. After the target sample is placed on the door sample stage 57 in the atmosphere, the door sample stage 57 is raised, and the contact seal connection is made by O-ring at the lower vacuum container wall 59. The vacuum container 12 is depressurized, and a predetermined process gas is introduced from the process gas inlet 20. By introducing a high frequency electromagnetic wave along the traveling direction of the high frequency wave 47, a high frequency plasma having a plasma boundary plane 16 is generated in the vacuum container 12.

The dielectric outer container 40 is configured of a fluororesin film layer 53 and a quartz tube 54, and the quartz tube 54 is coated on an outer side face with a fluororesin film layer 53 The spatial region 149 is provided between the outer side face of the fluororesin film layer 53 (i.e., the outer surface of the dielectric outer container 40) and the aluminum covering conductor 43 is a ground potential, the high frequency waveguide 44 is formed by the covering conductor 43 and the spatial region 149. The high frequency waveguide 44 is a spatial line in the waveguide surrounded by the covering conductor 43 which is grounded, and the line according to the waveguide is formed by extending connection to the spatial region 149.

A covering conductor 43 is also electrically connected to vacuum container walls 59 made of aluminum. In the present embodiment, the dielectric inner container 41 is disposed inside and coaxially of the dielectric outer container 40 so that the distance from the inner side face of the dielectric inner container 41 to the outer side face of a fluororesin film layer 53 in the dielectric outer container 40 is ¼ wavelength of the high frequency wave to be guided.

In addition, for the purpose of cooling the dielectric outer container 40 and the dielectric inner container 41, a structure is adopted in which a gas or a liquid having a small dielectric constant flows from a cooling medium inlet 71 in the vacuum container wall 59 on the lower side into a region between the dielectric outer container 40 and the dielectric inner container 41, and the gas or the liquid is discharged from a cooling medium outlet 72 in the vacuum container wall 59 on the upper side.

The high frequency wave coupling portion 42 connects the high frequency waveguide 44 with the dielectric outer container 40, and the high frequency wave 47 propagates along the high frequency waveguide 44 via the high frequency wave coupling portion 42. The spatial region 149 between the dielectric outer container 40 and the aluminum covering conductor 43 functions as a high frequency waveguide 44. Although the electric field direction generally varies depending on the electromagnetic wave mode of the high frequency wave 47, in the high frequency reaction processing apparatus 100, the electric field direction is configured so that the electromagnetic wave propagates in the circular tube circumferential direction of the dielectric outer container 40, which is a circular tube, using a TM11 mode. As a result, an infinitely long dielectric propagation line in which the electromagnetic wave returns on the side surface of the circular tube in a loop is formed.

The length of the inner contour in the front cross section of the dielectric outer container 40 is designed to be an integral multiple of ¼ wavelength of the high frequency wave to be guided. Thus, the high frequency wave 47 which propagates along with the circumferential direction of the dielectric outer container 40 as a dielectric propagation line causes a resonance of the propagation line.

Further, the high frequency waveguide 44 of cavity by the spatial region between the outer side face of the dielectric outer container 40 and the grounded covering conductor 43 is formed, and it is possible to reduce the attenuation of high frequency wave in the infinitely long dielectric propagation line to return in a loop. Thus, the electromagnetic wave does not leak outward, and the surface wave forming a leakage electric field are generated widely along the propagation line in the inner radial direction of the dielectric outer container 40. Further, the covering conductor 43 is kept at a ground potential. Thus, a large number of points with high electric field is widely generated in a loop at a position of an integer multiple of ¼ wavelength of the surface wave guided into the inside of the conductor surface.

As described above, the position of the inner side face of the dielectric inner container 41 configuring the wall surface of the vacuum container 12 coincides with the point with the high electric field of the surface wave. Thus, plasma can be generated in the vacuum chamber 12 easily and instantaneously from the introduction of the high frequency wave 47.

When plasma is generated, a plasma boundary plane 16 is formed inside the dielectric inner container 41. Because the plasma itself has a variable impedance, a part of the surface wave is absorbed by the plasma, and other parts of the surface wave is reflected by the plasma boundary plane 16. The reflected wave repeats alternately reflection and propagation in the region formed by the plasma boundary plane 16 via the dielectric outer container 40 and the dielectric inner container 41 by the covering conductor 43.

The propagation line impedance of the high frequency wave in this region varies in conjunction with the impedance of the plasma. Then, this region forms a matching circuit of ¼ wavelength impedance transformer. Thus, resonance occurs in conjunction with the plasma. As a result, impedance matching between the propagation line and the plasma load is achieved, and eventually electromagnetic wave energy is efficiently absorbed into the plasma load.

Further, with an increase in the introduced power, the plasma density increases and the plasma boundary plane 16 begins to have a property close to the conductor. Then, even if the reflection standing wave in the propagation line of the ¼ wavelength impedance transformer is increased, a capacitance property of the propagation line is increased to form a parallel resonant circuit as a whole. Therefore, the increase of the reflection standing wave works in the direction to increase the current value for the plasma load, and the plasma ionization efficiency increases. Thus, no reflected wave is returned to the high frequency waveguide 44, the non-reflection state is realized when the load is viewed from the oscillation side.

Further, the vacuum container 12 functions as a cylindrical cavity resonator when there is no plasma load as a whole and functions as a dielectric resonator when there is a plasma load. Therefore, power can be efficiently absorbed in the load.

As shown in FIGS. 1A and 1B, even when high frequency waves 47 are guided from a plurality of high frequency waveguide 44, the standing wave is confined in an area corresponding to the matching circuit of the ¼ wavelength impedance transformer. Thus, a plurality of oscillating portions can inject power into the load without interfering with each other, and thereby a large power is obtained for the apparatus.

Here, specific dimensions and capacities of the high frequency reaction processing apparatus of the present embodiment are shown as an example. The frequency of the high frequency wave 47 is 2.45 GHZ, the electromagnetic wave mode thereof is TM11 mode, and the maximal power thereof is 1 kW. The high frequency wave coupling portion 42 connects to the dielectric outer container 40 at the opening of the width 70 mm height 130 mm. A quartz tube 54 having an outer diameter of 150 mm, thick of 3 mm and Z-axis direction length of 200 mm is coated on an outer side face with a fluororesin film layer 53 made of PTFE having a thickness of 2 mm, and the dielectric outer container 40 is formed by them. The dielectric inner container 41 is formed of a quartz tube 55 having an outer diameter of 115 mm, thick of 3 mm and Z-axis direction length of 200 mm. The covering conductor 43 made of aluminum is formed of an aluminum plate having a thickness of 0.5 mm. A spatial region of 3 mm is provided between the covering conductor 43 made of aluminum and the outer side face of the dielectric outer container 40 whose outer side face is coated with the fluororesin film layer 53 made of PTFE having a thickness of 2 mm.

The vacuum container wall 59 made of aluminum is formed in a disc shape having a thickness of 20 mm and outer diameter of 200 mm, the vacuum container wall on the lower side has a hole of 100 mm diameter at its center, and the hole is closed by the door sample stage. The decompression exhaust port 56 is a tube having an inner diameter of 20 mm and an outer diameter of 1 inch and is connected to a vacuum pipe from a vacuum pump by a connection joint of O-ring seal. The cooling medium inlet 71 is connected with a joint of ¼ inch gas pipe and supplies dry air at 30 psi for cooling.

In the present embodiment, the process gas inlet 20 and the decompression exhaust port 56 are provided in the same vacuum container wall 59, but they may be provided separately on the opposing vacuum container walls 59.

Example 1-1

A test example of plasma generation in the present embodiment is described below. A high frequency reaction processing apparatus according to the above configuration example was used. As the vacuum condition, the pressure was set to 13 Pa to 1000 Pa, and $N_2$, $O_2$ and a mixed gas thereof were used. The gas flow rate was 50 cc/min to 300 cc/min. As microwave power, 2 units were supplied for 50 W to 1000 W per unit. As for the vacuum pump system, a rotary pump with pumping quantity 1000 L/min was used. The degree of vacuum was measured by a pirani vacuum gauge on a vacuum exhaust line. The pressure was adjusted by adjusting the opening and closing of the manual switching valve on the vacuum exhaust line. The plasma discharge was obtained instantaneously from power input under all the above generating conditions. Then, plasma with uniform plasma emission was obtained throughout the vacuum container. Even if continuous operation was performed for 1000 hours or more, no abnormality was observed in the magnetron oscillating portion.

Example 1-2

A test example of the processing efficiency in the present embodiment is described below. As a sample, an organic photoresist having a thickness of 2 μm coated on a silicon substrate having an area of 20 $cm^2$ was used to test the stripping rate. As process conditions, the substrate temperature was set to room temperature, the microwave power was set to 500 W, the process gas was set to oxygen (100 cc/min), the process pressure was set to 150 Pa, and the process time was set to 20 seconds. In the high frequency reaction processing apparatus of the present example, the photoresist stripping rate was 4 μm/min. This is a result of 150% over the prior art. In the conventional high frequency reaction processing apparatus as a comparative example, it was different only that the inner diameter of the covering conductor made of aluminum coincided with the outer diameter of the dielectric outer container not to provide a spatial region, and other conditions were the same. The substrate temperature after the process was measured to be about 60° C., and the organic matter stripping could be performed at high speed without increasing the substrate temperature.

In the case of using an ordinary organic matter stripping apparatus using oxygen microwave plasma, the stripping rate increases as the substrate temperature rises. In the case, unless the temperature of the substrate is raised to more than 140 degrees, which is the glass transition point of the organic resist film, a stripping rate of 1 μm/min or more cannot be obtained. The reason why the substrate temperature did not rise and the stripping speed is high in the high frequency reaction processing apparatus of the present example can be determined to be that the high-density excited plasma was generated in the plasma boundary plane in the vicinity of the inner wall part of the dielectric inner container 41 and that a large amount of oxygen radicals were generated.

Second Embodiment

In the above embodiment, when the load inside the inner container is a decompression plasma discharge, the plasma discharge body diffuses to the entire inner container, the gas introducing portion and the decompression pipe portion. Since the plasma discharge body is a conductor, the high frequency wave propagates in the plasma discharge body and also to the decompression seal portion in the outer end face of the inner container. Then, as a result of that the high frequency wave is absorbed by the sealing material having a dielectric loss, the sealing material is deteriorated by heat, and eventually the hermetic seal is deteriorated. In addition, absorption of ultraviolet ray by luminescence radiation of the plasma discharge body and heat generated thereby also provide affection. It is a subject matter to cut off the vacuum ultraviolet ray by electroluminescence and the electromagnetic wave to the member at the end of the inner container.

Figure 3A:
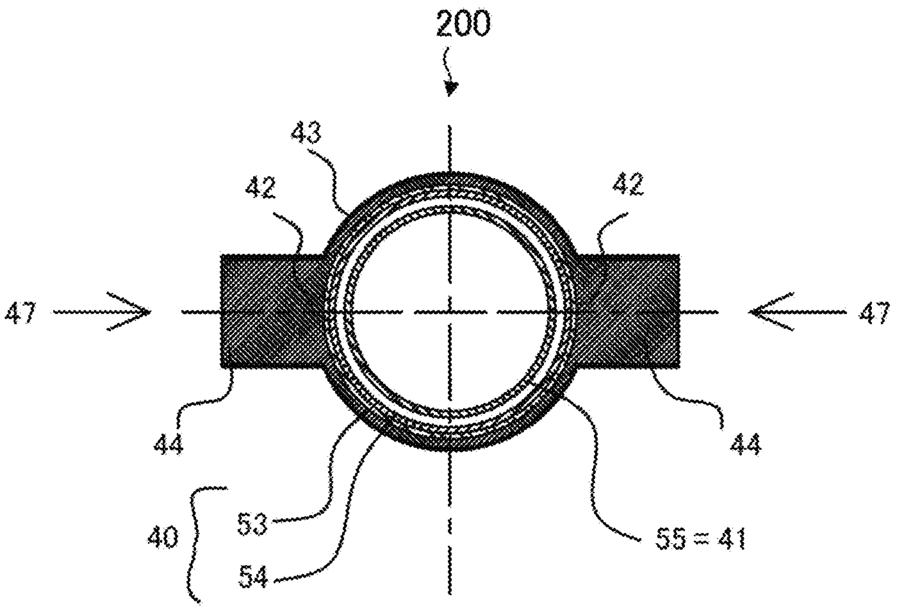
FIGS. 3A and 3B are respectively a cross-sectional plan view and a cross-sectional front view on y1-y2 of the high frequency reaction processing apparatus according to the second embodiment.
Figure 3B:
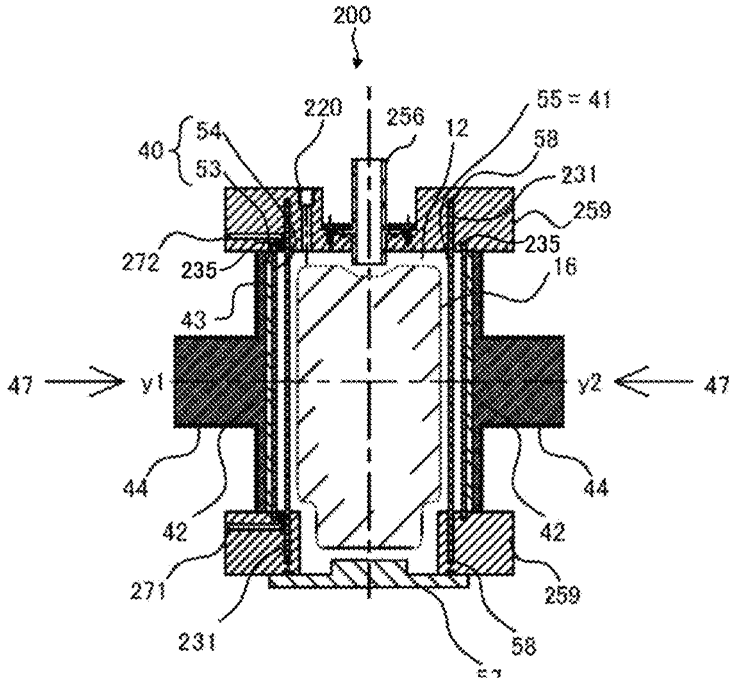
Figure 4:
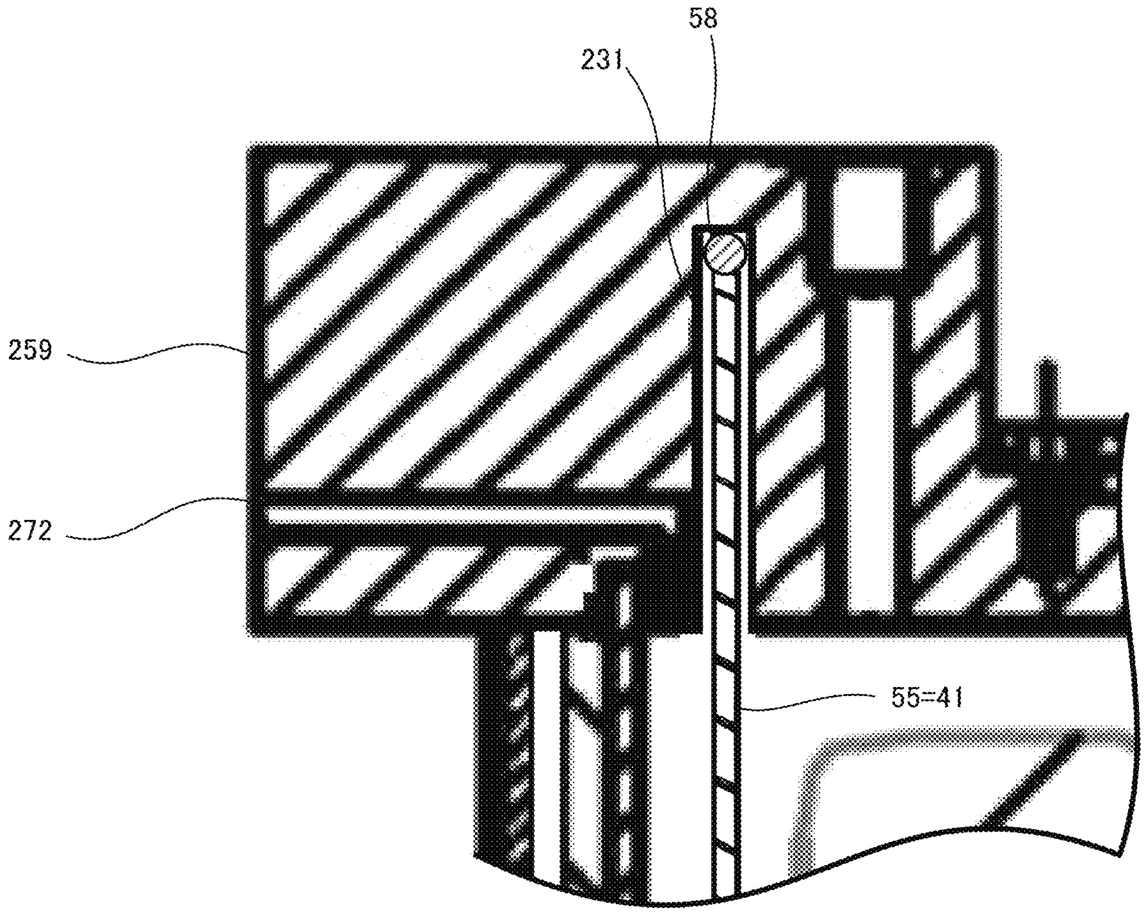
FIG. 4 is an enlarged cross-sectional front view of the high frequency reaction processing apparatus according to the second embodiment.

FIGS. 3A and 3B are respectively a cross-sectional plan view and a cross-sectional front view on y1-y2 of the high frequency reaction processing apparatus according to the second embodiment. The high frequency reaction processing apparatus 200 comprises a dielectric outer container 40 (outer container), a covering conductor 43 (covering portion), high frequency wave coupling portions 42, a dielectric inner container 41 (inner container) and vacuum container walls 259 (lid portions). The dielectric outer container 40 is configured of a fluororesin film layer 53 and a quartz tube 54. The dielectric inner container 41 is configured of a quartz tube 55. As shown in FIGS. 3A and 3B, the high frequency reaction processing apparatus 200 can constitute a discharge portion of a high frequency plasma apparatus. FIG. 4 is an enlarged cross-sectional front view showing the high frequency reaction processing apparatus 200.

The vacuum container wall 259 comprises a groove 231 (fitting groove) for fitting the end of the dielectric inner container 41. The groove 231 has a depth with a length of ⅛ wavelength or more and ½ wavelength or less of the wavelength of the high frequency wave to be guided and accommodates the end of the dielectric inner container 41 without contacting with the side surface of the dielectric inner container 41. Thus, since the electromagnetic wave is choked without entering the groove 231, it is possible to keep a low temperature of the end part of the dielectric inner container 41. The groove 231 has a depth of ¼ wavelength or more of the wavelength of the high frequency wave to be guided. Thus, the high frequency wave can be choked so as not to lead to the end part of the dielectric inner container 41.

An O-ring 58 (seal member) is provided between the dielectric inner container 41 and the vacuum container wall 259 to seal the inner cavity of the dielectric inner container 41. The O-ring 58 is provided at any of the positions accommodated by the groove 231. Thus, the temperature of the O-ring 58 for sealing the dielectric inner container 41 can be kept low, it is possible to prevent damage to the O-ring 58.

The dielectric inner container 41 can be made of alumina. Thus, it is possible to improve the durability against corrosive gas at high temperatures. For example, that is effective in the case of generating plasma in the inner cavity of the dielectric inner container 41. As a result, plasma can be generated with high efficiency.

In the case where the reaction processing of the target material is performed by the electromagnetic wave guided from the high frequency wave coupling portion in the inner cavity of the dielectric inner container 41, it is preferable that the dielectric inner container 41 is made of quartz. As a result, it can be applied to decomposition of fluorocarbon and scrubbers.

As in the first embodiment, the vacuum container 12 is configured of the cylindrical quartz tube 55, aluminum vacuum container walls 59 on the upper and lower sides and an aluminum door sample stage 57 and is vacuum-sealed by the O-rings 58. The dielectric inner container 41 is configured of a quartz tube 55. The present embodiment is not limited to the modification from the first embodiment and may be a modification from a high frequency reaction processing apparatus without the spatial region.

In the first embodiment, the O-ring 58 may be subjected to exposure deterioration due to long-term use of the apparatus and conditions of use due to absorption of leaked electromagnetic waves, heat and plasma discharge vacuum ultraviolet ray from the high frequency plasma having the plasma boundary plane 16 generated within the vacuum container 12.

In the present embodiment, the grooves 231 having a width of ⅛ wavelength or less and a depth of ¼ wavelength or more of the high frequency wave used are respectively formed in the aluminum vacuum container walls 259 on the upper and lower sides. Then, the seal parts for both end faces of the cylindrical quartz tube 55 are provided inside the groove 231.

This structure chokes the high frequency wave, and the high frequency wave does not leak to the seal part configured in the groove. Further, the vacuum ultraviolet ray of the plasma discharge is shielded by the above groove to suppress the deterioration of the O-ring.

Further, it is preferable that the inside of the aluminum vacuum container walls 259 on the upper and lower sides have water cooling structures. Thus, it is also possible to deal with deterioration caused by heat.

As a result, the deterioration of the decompression seal can be suppressed even under severe conditions in continuous high-power high-density plasma generation for a long time, and maintenance-free is realized.

Here, specific dimensions and capacities of the high frequency reaction processing apparatus according to the present embodiment are shown as an example. The frequency of the high frequency wave 47 is 2.45 GHz, the electromagnetic wave mode thereof is TM11 mode, and the maximal power thereof is 1 kW. The high frequency wave coupling portion 42 connects to the dielectric outer container 40 at the opening having the width of 70 mm and height of 130 mm. The dielectric outer container 40 is formed by a quartz tube 54 having an outer diameter of 150 mm, a thickness of 3 mm and Z-axis length of 200 mm and a fluororesin film layer 53 made of PTFE having a thickness of 2 mm covering the outer side face of the quartz tube 54.

The dielectric inner container 41 is formed by a quartz tube 55 having an outer diameter of 115 mm, a thickness of 3 mm and Z-axis direction length of 260 mm. The covering conductor 43 made of aluminum is formed by an aluminum plate having a thickness of 0.5 mm. A spatial region of 3 mm is provided between the outer side face of the aluminum covering conductor 43 and the dielectric outer container 40.

The vacuum container wall 259 made of aluminum is a disc-shaped member having a thickness of 50 mm and outer diameter of 200 mm and is water-cooled with a water-cooling channel. Further, the groove 231 is formed with an outer diameter of 160 mm, inner diameter of 140 mm and depth of 30 mm.

The vacuum container wall on the lower side has a hole with a diameter of 100 mm in the center, and the hole is closed by the door sample stage. The decompression exhaust port 256 is a tube having an inner diameter of 20 mm and an outer diameter of 1 inch and is connected to a vacuum pipe from the vacuum pump by a connection joint having an O-ring seal. The cooling medium inlet 71 is connected to a ¼ inch gas pipe joint, and dry air for cooling is supplied at 30 psi in use of the inlet.

Example 2

A test example of continuous plasma generation in the present embodiment is described below. As the vacuum condition, the pressure is 130 Pa, and the used gas is $N_2$ gas. As microwave power, two units were provided for 1000 W per unit. As the vacuum pumping system, a rotary pump for the pumping quantity 1000 L/min was used. Vacuum was measured by a pirani vacuum gauge on a vacuum exhaust line, and pressure was adjusted by opening and closing adjustment of a manual switching valve on the vacuum exhaust line. Under all of the above conditions, plasma discharge was obtained instantaneously from power-on and plasma which produced plasma emission uniform throughout the vacuum container was obtained. In addition, even if continuous operation is performed for 1000 hours or longer, no problem occurs in the vacuum seal, and no deterioration was observed in the clear silicone O-ring having a hardness of 50 degrees used as the seal O-ring.

In the present embodiment, a process gas inlet 220 and a decompression exhaust port 256 are provided in the same vacuum container wall 259, but they may be provided separately in the vacuum container walls 259 facing each other.

In the present embodiment, the O-ring 58 is provided at the bottom of the groove 231 and configures a seal portion at the end face of the quartz tube 55 but may configure a seal portion on the outer side face or the inner side face near the end face of the quartz tube 55.

Third Embodiment

In the first embodiment, it is possible to realize the input of a large output for a load with a large volume and large area by increasing the diameter of the inner container and coupling a plurality of the high frequency wave coupling portions to the same load. However, since the curvature of the side surface of the inner container becomes constant or more to planarize the side surface by increasing the diameter of the inner container, it become difficult to make an infinitely long dielectric propagation line that the high frequency propagation line is returned in a loop with the dielectric container. Especially, a measure becomes necessary in the application to the decompression plasma reaction processing apparatus which requires the processing in large area.

Figure 5A:
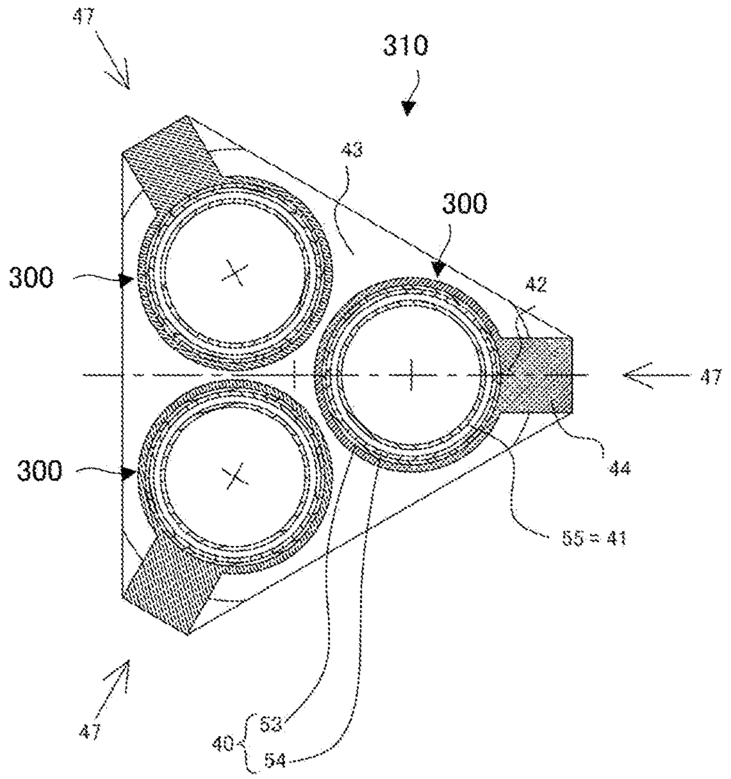
FIGS. 5A and 5B are respectively a cross-sectional plan view and a cross-sectional front view on y1-y2 of the high frequency reaction processing system according to the third embodiment.
Figure 5B:
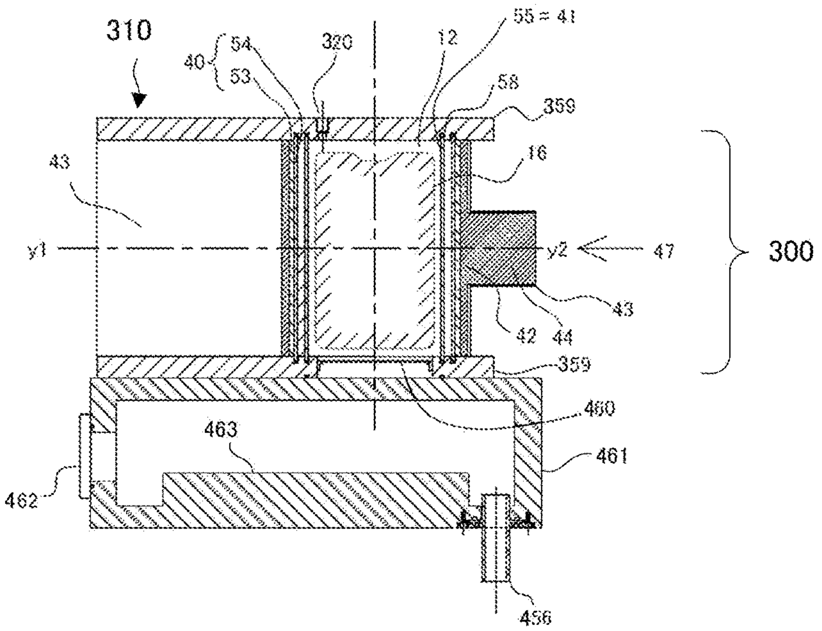

FIGS. 5A and 5B are respectively a cross-sectional plan view and a cross-sectional front view on y1-y2 of the high frequency reaction processing system 310 according to the third embodiment. The high frequency reaction processing system 310 comprises a plurality of high frequency reaction processing apparatuses 300 and a single downflow processing chamber container 461. The high frequency reaction processing apparatus 300 comprises a dielectric outer container 40 (outer container), a covering conductor 43 (covering portion), high frequency wave coupling portions 42, a dielectric inner container 41 (inner container) and vacuum container walls 359 (lid portions). The plurality of high frequency reaction processing apparatuses 300 are formed in the same shape, arranged centrally symmetrically, and share the vacuum container walls 359 with each other. Thus, it is possible to perform the high frequency reaction process in a well-balanced arrangement.

The dielectric outer container 40 is configured of a fluororesin film layer 53 and a quartz tube 54. The dielectric inner container 41 is configured of a quartz tube 55. As shown in FIGS. 5A and 5B, the high frequency reaction processing system 310 can configure a discharge portion of the high frequency plasma apparatus.

The downflow processing chamber container 461 is connected to the inner cavity (inner space) of the dielectric inner container 41 via one end face of the dielectric inner container 41 in each of the plurality of high frequency reaction processing apparatuses 300. Thus, a processing reaction with a large output can be expanded to a large area.

The outer containers in the plurality of the high frequency reaction processing apparatuses 300 are cylindrical, and the curvature radiuses of the cylindrical outer containers are 150 mm or less. Thus, since it is possible to reduce the curvature radius, the electromagnetic wave can be kept travelling.

The present embodiment is a modification from the first embodiment and aims at processing substrates of the large diameter. Then, the present embodiment has high efficiency and easily realizes a processing apparatus of a large diameter when a plurality of high frequency waves is guided to the same load. The present embodiment is not limited to the modification from the first embodiment and may be a modification from a high frequency reaction processing apparatus without a spatial region or may be a modification from the second embodiment.

As shown in FIGS. 5A and 5B, three vacuum containers 12 serving as the center of the plasma discharge portion are configured of three cylindrical quartz tubes 55 and a pair of aluminum vacuum container walls 359 on the upper and lower sides. The quartz tube 55 configures a dielectric inner container 41. The vacuum container 12 is connected to the downflow processing chamber container 461 with a large diameter in the lower aluminum vacuum container wall, and thereby the entire vacuum container is configured.

The high frequency plasma formed in each of the three vacuum containers 12 has a plasma boundary plane 16 and is separated from the downflow processing chamber container 461 by a porous conductor plate 460. In the present embodiment, a high frequency reaction processing system is used as a plasma source of a plasma radical down-flow processing apparatus.

The process to the radical surface processing by the plasma radical down flow processing apparatus is outlined as below. First, a target sample is carried into the sample table 463 in the downflow processing chamber container 461 from the door 462. After the door is closed, gas is exhausted from the decompression exhaust port 456, the pressure is reduced, and the gas for plasma generation is introduced in equal distribution while the flow rate from the three process gas inlets 320 is controlled.

Plasma is formed in each of the vacuum containers 12 by supply of high frequency waves 47 from three oscillation sources. The generated reaction active species is transferred to the downflow processing chamber container 461 which is in a decompression direction through the hole portions of the porous conductor plate 460, and the radical surface reaction processing is performed on the sample.

The configuration of the vacuum container 12 serving as the central part of the discharge portion is the same as that of the first embodiment except for the decompression exhaust port. In the embodiment shown in FIGS. 5A and 5B, there is one high frequency waveguide 44 but may be a plurality.

Here, specific dimensions and capacities of the high frequency reaction processing system according to the present embodiment are shown as an example. The frequencies of the high frequency waves 47 of the three oscillation sources are 2.45 GHz, their electromagnetic wave mode is TM11 mode, and their maximal power is 1 kW. The high frequency wave coupling portion 42 connects to the dielectric outer container 40 at the opening with the width of 70 mm and height of 130 mm. The dielectric outer container 40 is formed by a quartz tube 54 and a PTFE fluororesin film layer 53 having a thickness of 4 mm covering the outer side face of the quartz tube 54 having an outer diameter of 150 mm, a thickness of 3 mm and a Z-axis length of 200 mm. The dielectric inner container 41 is formed of a quartz tube 55 having an outer diameter of 115 mm, a thickness of 3 mm and a Z-axis direction length of 200 mm. The covering conductor 43 made of aluminum is formed by cutting from an integral aluminum block, includes three vacuum containers 12, and is cooled by a water-cooling channel provided therein.

The vacuum container wall 359 made of aluminum is obtained by processing a plate having a thickness of 30 mm outer diameter of 380 mm. The aluminum vacuum container wall 359 has three holes arranged at equal angles of P.C.D600φ from the center of the integral vacuum container wall on the lower side and is connected to the aluminum downflow processing chamber container 461 by an O-ring seal. Three porous conductor plates 460 are provided at hole positions having a diameter of 100 mm at an angular arrangement equal to P.C.D600φ from the center of the vacuum container wall on the lower side. Each of the porous conductor plate 460 is made of stainless steel and is formed in a mesh shape having a porosity of 30% with a thickness of 2 mm and a diameter of 100 mm. Each of the porous conductor plate 460 separates the plasma formed in the region of the vacuum container 12 between the vacuum container 12 and the downflow processing chamber container 461. The decompression exhaust port 456 is a NW40 bore pipe as a vacuum pipe and is connected to the vacuum pipe from the vacuum pump by a connection joint having an O-ring seal.

To the high frequency waveguide 44, the gas pipe joint with ¼ inch as the cooling medium inlet is connected. The cooling medium inlet is supplied with dry air at 30 psi for cooling.

In the present embodiment, the operating conditions and impedance matching of the ionizing plasma discharges shown in FIGS. 5A and 5B are the same as those of the first embodiment.

Thus, a high-performance processing apparatus is realized by mounting the high-efficiency plasma generating source having the high frequency waveguide 44 with a small curvature to the plurality-type identical processing load.

[Others]

Although quartz is used as a structural material of the dielectric inner container 41 in the above embodiment, other dielectric with low dielectric constant can be used. For example, any alumina-based ceramic can be used. Further, as the dielectric outer container 40 all the dielectric with low dielectric constant can be used. Further, the dielectric outer container 40 may be formed by laminating a plurality of dielectric layers of different materials.

In addition, in the above embodiments, the fluororesin film layer 53 made of PTFE that coats the outer side face of the quartz tube 54 is used in the dielectric outer container 40, but a fluororesin having a depletion layer may be used. In this case, the performance of the dielectric propagation line can be improved by selecting an appropriate depletion rate to adjust the dielectric constant of the fluororesin layer. Alternatively, a thin mica may be coated on the outer side face of the quartz tube 54 in a layered structure. Also, porous ceramics can be used as the dielectric outer container 40 for the same purpose.

Further, in the above embodiments, two high frequency wave coupling portions 42 are provided and arranged symmetrically for the cylindrical axis center, but one or three or more high frequency wave coupling portions around the cylindrical axis may be provided, and further a plurality may be provided in the cylindrical axial direction.

In the above embodiments, all of the dielectric inner container 41, the dielectric outer container 40 and the covering conductor 43 are formed in a cylindrical shape, but they may be formed in an elliptical cylindrical shape. Further, in the dielectric inner container 41 of the above embodiments, the end face is open, but it may be formed also by closing the upper and lower end faces other than the inlet and outlet of the gas. The dielectric inner container 41 of such a shape is preferably made of quartz than alumina in considering ease of manufacture.

This international application claims priority based on Japanese Patent Application No. 2020-51160, filed on Mar. 23, 2020, the entire of Japanese Patent Application No. 2020-51160 are incorporated by reference.

DESCRIPTION OF SYMBOLS

12 vacuum container
16 plasma boundary plane
20 process gas inlet
40 dielectric outer container
41 dielectric inner container
42 high frequency wave coupling portion
43 covering conductor
44 high frequency waveguide
47 high frequency wave
53 fluororesin film layer
54 quartz tube
55 quartz tube
56 decompression exhaust port
57 door sample stage
58 O-ring
59 vacuum container wall
71 cooling medium inlet
72 cooling medium outlet
100 high frequency reaction processing apparatus
149 spatial region
200 high frequency reaction processing apparatus
220 process gas inlet
231 groove
256 decompression exhaust port
259 vacuum container wall
271 cooling medium inlet
272 cooling medium outlet
300 high frequency reaction processing apparatus
310 high frequency reaction processing system
320 process gas inlet
359 vacuum container wall
456 decompression exhaust port
460 porous conductor plate
461 downflow processing chamber container
462 door
463 sample stage

The invention claimed is:

1. A high frequency reaction processing apparatus for processing silicon substrates, comprising:

an outer container made of a dielectric material and having an inner cavity capable of being closed by two end faces, a covering portion made of a conductive material, kept at the same potential as ground potential of a high frequency waveguide and provided only on the outside of the outer container, at least one high frequency wave coupling portion provided at any position of an outer surface of the covering portion, at least one inner container made of a dielectric material, provided at a position for receiving a high frequency wave travelling through the high frequency wave coupling portion without touching an inner side face of the outer container and having an inner cavity capable of being closed by two end faces, a lid portion made of conductor kept at the same potential as ground potential of the high frequency waveguide, the lid portion closing the inner cavity of the inner container at an end face of the inner container, the lid portion having a fitting groove for fitting an end part of the inner container, and a seal member provided between the inner container and the lid portion for scaling the inner cavity of the inner container, wherein the fitting groove has a depth with 30 mm or more and with a length of ⅛ wavelength or more and ½ wavelength or less of the guided high frequency wave and accommodates an end part of the inner container without contacting a side surface of the inner container, the seal member is provided in the vicinity of the bottom of the fitting groove, reaction process is performed by electromagnetic waves guided from the high frequency wave coupling portion in the inner cavity of the inner container, the covering portion forms a spatial region with an outer surface of the outer container and the distance between the covering portion and the outer surface of the outer container is 3 mm or more, and the covering portion and the spatial region form the high frequency waveguide, and the spatial region suppresses absorption of the electromagnetic waves by the outer container, thereby reducing the attenuation of high frequency wave in an infinitely long dielectric propagation line.

2. The high frequency reaction processing apparatus according to claim 1, wherein the inner container is made of alumina.

3. The high frequency reaction processing apparatus according to claim 1, wherein the fitting groove has a depth of ¼ wavelength or more of the guided high frequency wave.

4. The high frequency reaction processing apparatus according to claim 1, wherein the spatial region is formed by separating the inner surface of the covering portion and the outer surface of the outer container by 1/60 wavelength or more and 1/4 wavelength or less of the travelling high frequency wave.

5. The high frequency reaction processing apparatus according to claim 1, wherein the lid portion is provided on each end face of the outer container and the covering portion to close the inner cavity, and the lid portion has a locking portion for holding the outer container apart from the covering portion.

6. The high frequency reaction processing apparatus according to claim 1, wherein plasma is generated in the inner cavity of the inner container.

7. The high frequency reaction processing apparatus according to claim 1, wherein reaction processing of a target material is performed by an electromagnetic wave guided from the high frequency wave coupling portion in the inner cavity of the inner container.

8. A high frequency reaction processing system comprising:

a plurality of the high frequency reaction processing apparatuses according to claim 1 and a single processing chamber connected to the inner cavity of the inner container via an end face on one side of the inner container of each of the plurality of high frequency reaction processing apparatuses.

9. The high frequency reaction processing system according to claim 8, wherein the plurality of the high frequency reaction processing apparatuses is formed in a same shape and arranged centrally symmetrically, and end faces of the outer container and the inner container are shared with each other.

10. The high frequency reaction processing system according to claim 8, wherein the outer containers in the plurality of the high frequency reaction processing apparatuses are cylinders, and the outer containers of the cylinders have 150 mm or less of curvature radiuses.

* * * * *